US012700833B2

(12) United States Patent
Enomoto et al.

(10) Patent No.: US 12,700,833 B2
(45) Date of Patent: Aug. 4, 2026

(54) POWER AMPLIFIER

(71) Applicant: Murata Manufacturing Co., Ltd., Kyoto (JP)

(72) Inventors: Jun Enomoto, Kyoto (JP); Shohei Imai, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 422 days.

(21) Appl. No.: 18/544,917

(22) Filed: Dec. 19, 2023

(65) Prior Publication Data

US 2024/0204730 A1 Jun. 20, 2024

(30) Foreign Application Priority Data

Dec. 20, 2022 (JP) ................................. 2022-203315

(51) Int. Cl.
H03F 1/02 (2006.01)
H03F 1/56 (2006.01)
H03F 3/24 (2006.01)
H03F 3/60 (2006.01)

(52) U.S. Cl.
CPC ............. H03F 1/0288 (2013.01); H03F 1/56 (2013.01); H03F 3/245 (2013.01); H03F 3/602 (2013.01); H03F 2200/198 (2013.01); H03F 2200/204 (2013.01); H03F 2200/423 (2013.01); H03F 2200/451 (2013.01)

(58) Field of Classification Search
CPC .......... H03F 1/0288; H03F 1/56; H03F 3/245;

H03F 3/602; H03F 2200/198; H03F 2200/204; H03F 2200/423; H03F 2200/451; H03F 3/195; H03F 3/20
USPC ............................... 330/295, 124 R, 84, 286
See application file for complete search history.

(56) References Cited

U.S. PATENT DOCUMENTS 12,476,592 B2 * 11/2025 Takenaka .................. H01P 5/16
2021/0175853 A1 6/2021 Takenaka

FOREIGN PATENT DOCUMENTS

JP 2021-093715 A 6/2021

* cited by examiner

*Primary Examiner* — Hieu P Nguyen
(74) *Attorney, Agent, or Firm* — McDonald Hopkins LLC

(57) ABSTRACT

A power amplifier includes a first amplifier configured to amplify a first high-frequency signal, a second amplifier configured to amplify a second high-frequency signal delayed with respect to the first high-frequency signal by at least 90 degrees, a hybrid coupler including a first transmission line and a second transmission line, a first power-supply circuit for the first amplifier, a second power-supply circuit for the second amplifier, and an output matching network. The hybrid coupler is connected to an output end of the first amplifier at a first end of the first transmission line. The first transmission line is connected to the first power-supply circuit and the output matching network at a second end. The second transmission line is connected to an output end of the second amplifier at a first end. The second transmission line is connected to the second power-supply circuit at a second end.

12 Claims, 13 Drawing Sheets

110 — SECOND POWER-SUPPLY CIRCUIT

109 — FIRST POWER-SUPPLY CIRCUIT

VT

M/N — 106

20

POWER AMPLIFIER

CROSS REFERENCE TO RELATED APPLICATION

This application claims priority from Japanese Patent Application No. 2022-203315 filed on Dec. 20, 2022. The content of this application is incorporated herein by reference in its entirety.

BACKGROUND ART

The present disclosure relates to a power amplifier.

Doherty amplification circuits are known as a power amplifier having high efficiency. A Doherty amplification circuit typically has a configuration including a carrier amplifier and a peaking amplifier connected in parallel, and in this configuration, the carrier amplifier is configured to operate regardless of the power level of a radio-frequency input signal and the peaking amplifier is turned off when the power level of the radio-frequency input signal is low and is turned on when the power level of the radio-frequency input signal is high. In this configuration, when the power level of the radio-frequency input signal is high, the carrier amplifier operates keeping saturation at a saturated output power level. The Doherty amplification circuit may thus provide higher efficiency than ordinary power amplification circuits.

A configuration of a Doherty amplification circuit is disclosed that includes a hybrid coupler including a first transmission line and a second transmission line (for example, refer to Japanese Unexamined Patent Application Publication No. 2021-093715). In the configuration disclosed in Japanese Unexamined Patent Application Publication No. 2021-093715, a radio-frequency (RF) signal that is output from a carrier amplifier is input to a first end of the first transmission line, an RF signal that is output from a peaking amplifier is input to a first end of the second transmission line, a second end of the second transmission line is open, and the RF signal that is output from the carrier amplifier and the RF signal that is output from the peaking amplifier are synthesized and output from a second end of the first transmission line as a synthesized signal.

BRIEF SUMMARY

For example, if a die of a chip device to be flip-chip mounted to a front-end module includes main circuit blocks of a Doherty amplification circuit based on the technology of the art described above, electromagnetic coupling between the circuit blocks may occur, leading to performance degradation.

The present disclosure provides a power amplifier capable of reducing the possibility of performance degradation.

A power amplifier according to an aspect of the present disclosure includes: a first amplifier configured to amplify a first high-frequency signal; a second amplifier configured to amplify a second high-frequency signal delayed with respect to the first high-frequency signal by at least 90 degrees; a hybrid coupler including a first transmission line and a second transmission line; a first power-supply circuit configured to supply electric power to the first amplifier; a second power-supply circuit configured to supply the electric power to the second amplifier; and an output matching network, and the hybrid coupler is connected to an output end of the first amplifier at a first end of the first transmission line, connected to the first power-supply circuit and the output matching network at a second end of the first transmission line, connected to an output end of the second amplifier at a first end of the second transmission line, and connected to the second power-supply circuit at a second end of the second transmission line.

In this configuration, a power-supply line to the first transmission line may also serve as a signal output line to the output matching network. As a result, a power supply line to the power amplifier need not be laid over the output matching network. Thus, the possibility of performance degradation due to electromagnetic coupling between the power-supply line and the output matching network may be reduced. Further, for example, the power-supply line need not detour around the output matching network and a supply path to the chip device for the radio-frequency signal, and complicated wiring may be avoided. Thus, impediments to downsizing may be reduced.

According to the present disclosure, it is possible to provide a power amplifier having simplified wiring in a module and a mounted device, being downsized, and having improved performance.

BRIEF DESCRIPTION OF THE DRAWINGS

FIG. 4 is a cross-sectional view of a hybrid coupler in the YZ plane;

FIG. 9 is a conceptual plan view illustrating an example of an arrangement of main circuit blocks included in a chip device of the power amplifier according to the first modification to the first embodiment on a substrate of a front-end module;

DETAILED DESCRIPTION

Hereinafter, power amplifiers according to embodiments will be described in detail with reference to the drawings. It is to be noted that the present disclosure is not limited to the embodiments. Obviously, the embodiments are described for illustrative purposes, and partial substitutions or combinations of configurations illustrated in different embodiments are feasible. In a second embodiment and embodiments subsequent to the second embodiment, features common to a first embodiment will not be described, and only different features will be described. In particular, similar operations achievable by similar configurations will not individually be described in each of the embodiments.

First Embodiment

Figure 1:
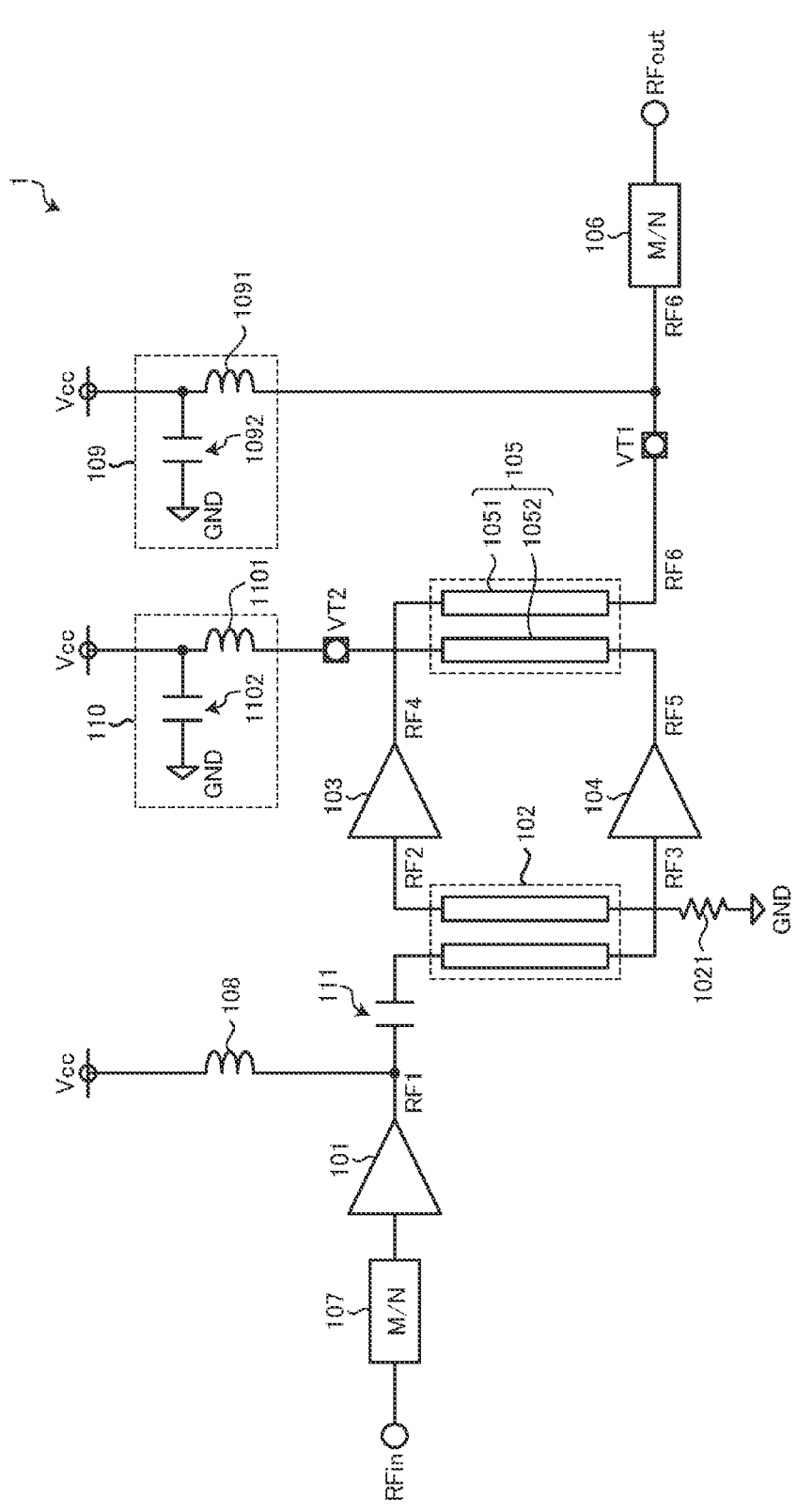
FIG. 1 illustrates an example of a configuration of a power amplifier according to a first embodiment.
Figure 2:
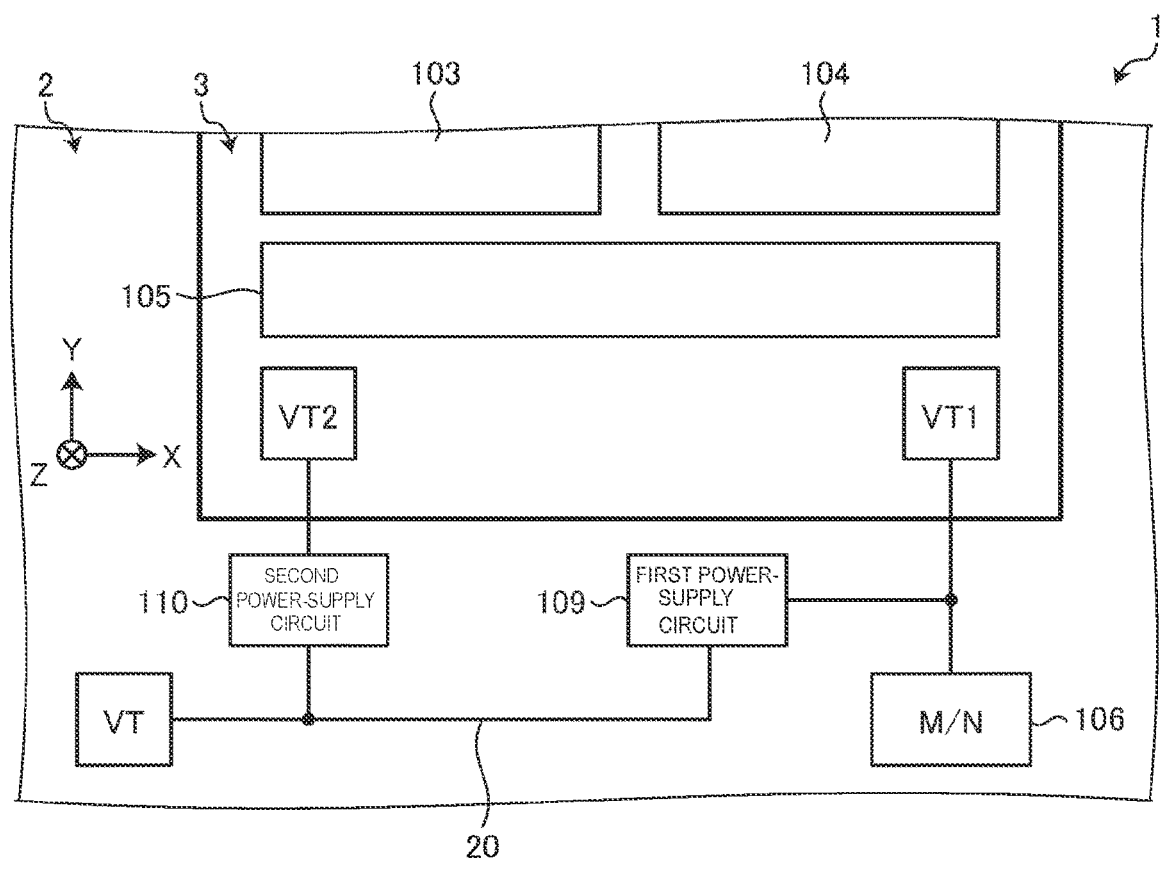
FIG. 2 is a conceptual plan view illustrating an example of an arrangement of main circuit blocks included in a chip device of the power amplifier according to the first embodiment on a substrate of a front-end module.

FIG. 1 illustrates an example of a configuration of a power amplifier according to the first embodiment. A power amplifier 1 is configured to amplify a radio-frequency input signal RFin and output a radio-frequency output signal RFout. FIG. 2 is a conceptual plan view illustrating an example of an arrangement of main circuit blocks included in a chip device of the power amplifier according to the first embodiment on a substrate of a front-end module.

FIG. 2 illustrates the power amplifier 1 mounted to the front-end module as an example. The front-end module is a small-sized integrated module that includes multiple integrated circuits and various functional components mounted to a substrate 2, which is parallel to the XY plane defined by the X direction and the Y direction perpendicular to the X direction, as illustrated in FIG. 2, and the integrated circuits and the functional components are integrally mounted to the front-end module in the Z direction, which is perpendicular to the XY plane. The substrate 2 parallel to the XY plane may be a substrate substantially parallel to the XY plane, such as a substrate having a slightly uneven surface. Examples of the substrate 2 include a laminated ceramic substrate, such as a low temperature co-fired ceramic (LTCC) substrate, a multilayer resin substrate, and a film substrate.

As illustrated in FIG. 1, the power amplifier 1 includes a first-stage amplifier 101, a phase shift circuit (distributor) 102, a carrier amplifier (first amplifier) 103, a peaking amplifier (second amplifier) 104, a hybrid coupler 105, an output matching network 106, an input matching network 107, a choke inductor 108, a first power-supply circuit 109, a second power-supply circuit 110, and a capacitor 111. In the present disclosure, the power amplifier 1 serves as a Doherty amplification circuit.

A die of a chip device 3, which is parallel to the XY plane, includes main circuit blocks of the power amplifier 1, and the die is flip-chip mounted to the substrate 2 of the front-end module in the Z direction. FIG. 2 illustrates an example in which the die of the chip device 3 includes at least the carrier amplifier (first amplifier) 103, the peaking amplifier (second amplifier) 104, and the hybrid coupler 105. In the present disclosure, the output matching network 106 is disposed on the substrate 2 of the front-end module. In the configuration according to the first embodiment illustrated in FIG. 1 and FIG. 2, the first power-supply circuit 109 (a choke inductor 1091) and the second power-supply circuit 110 (a choke inductor 1101) are disposed on the substrate 2 of the front-end module.

The first-stage amplifier 101 is configured to amplify the radio-frequency input signal RFin that is input via the input matching network 107 and output a first RF signal RF1. The frequency of the radio-frequency input signal RFin is, for example, approximately a few GHz. A power-supply voltage Vcc is supplied to the first-stage amplifier 101 via the choke inductor 108.

The carrier amplifier (first amplifier) 103, the peaking amplifier (second amplifier) 104, and the hybrid coupler 105 are second-stage amplification circuits configured to amplify the first RF signal RF1 that is output from the first-stage amplifier 101.

The phase shift circuit (distributor) 102 is configured to split the first RF signal RF1, which is output from the first-stage amplifier 101 via the capacitor 111, into a second RF signal RF2 (first high-frequency signal) and a third RF signal RF3 (second high-frequency signal), and the second RF signal RF2 and the third RF signal RF3 are respectively delivered to the carrier amplifier (first amplifier) 103 and the peaking amplifier (second amplifier) 104. The phase shift circuit (distributor) 102 is a circuit configured to delay the phase of the third RF signal RF3 (second high-frequency signal) with respect to the phase of the second RF signal RF2 (first high-frequency signal) by approximately 90 degrees ($\lambda/4$). The case where the phase shift circuit (distributor) 102 delays the phase of the third RF signal RF3 (second high-frequency signal) with respect to the phase of the second RF signal RF2 (first high-frequency signal) by 90 degrees also includes cases where the phase shift circuit (distributor) 102 delays the phase of the third RF signal RF3 (second high-frequency signal) with respect to the phase of the second RF signal RF2 (first high-frequency signal) by 90 degrees±45 degrees.

Specifically, the phase shift circuit (distributor) 102 includes, for example, a transmission line and a 90-degree hybrid coupler. In the example illustrated in FIG. 1, the phase shift circuit (distributor) 102 is a 90-degree hybrid coupler formed of two transmission lines. In this case, the third RF signal RF3 (second high-frequency signal) is input to the input end of the peaking amplifier (second amplifier) 104 via a first of the transmission lines, and the second RF signal RF2 (first high-frequency signal) is input to the input end of the carrier amplifier (first amplifier) 103 from one end of a second of the transmission lines electromagnetically coupled to the first transmission line. The second transmission line is connected at the other end to a reference potential (GND potential) with a terminator resistor 1021 interposed therebetween.

The carrier amplifier (first amplifier) 103 is configured to amplify the second RF signal RF2 (first high-frequency signal) from the phase shift circuit (distributor) 102 and output a fourth RF signal RF4 from the output end of the carrier amplifier (first amplifier) 103.

The peaking amplifier (second amplifier) 104 is configured to amplify the third RF signal RF3 from the phase shift circuit (distributor) 102 and output a fifth RF signal RF5 from the output end of the peaking amplifier (second amplifier) 104.

The hybrid coupler 105 includes a first transmission line 1051 and a second transmission line 1052. In the present disclosure, the hybrid coupler 105 serves as a 90-degree hybrid coupler. The hybrid coupler 105 is configured to receive at a first end of the first transmission line 1051 the fourth RF signal RF4 that is output from the carrier amplifier (first amplifier) 103 and receive at a first end of the second transmission line 1052 the fifth RF signal RF5 that is output from the peaking amplifier (second amplifier) 104. The hybrid coupler 105 is configured to output from a second end of the first transmission line 1051 a sixth RF signal RF6 that is a synthesized signal obtained through synthesis of the fourth RF signal RF4 that is output from the carrier amplifier (first amplifier) 103 and the fifth RF signal RF5 that is output from the peaking amplifier (second amplifier) 104.

In the present disclosure, the power-supply voltage Vcc is supplied to the second end of the first transmission line 1051 via the first power-supply circuit 109. In other words, the power-supply voltage Vcc is supplied to the carrier amplifier (first amplifier) 103 via the first power-supply circuit 109 and the first transmission line 1051. In the first embodiment, the first power-supply circuit 109 includes the choke inductor 1091 and a capacitor 1092.

The choke inductor 1091 is electrically connected in series between a power-supply terminal VT of the front-end module and the connection point between the second end of the first transmission line 1051 of the hybrid coupler 105 and the output matching network 106. The power-supply terminal VT serves as a terminal for receiving electric power from an external power supply (not illustrated) to the front-end module. The choke inductor 1091 is electrically connected at a first end to the connection point between the second end of the first transmission line 1051 of the hybrid coupler 105 and the output matching network 106. The choke inductor 1091 is electrically connected at a second end to the power-supply terminal VT of the front-end module with a power-supply line 20 interposed therebetween. The power-supply voltage Vcc is applied to the carrier amplifier (first amplifier) 103 via the choke inductor 1091 and the first transmission line 1051 of the hybrid coupler 105.

The capacitor 1092 is electrically connected to the second end of the choke inductor 1091 at one end and is electrically connected to the reference potential (GND potential) at the other end.

In the present disclosure, the power-supply voltage Vcc is supplied to the second end of the second transmission line 1052 via the second power-supply circuit 110. In other words, the power-supply voltage Vcc is supplied to the peaking amplifier (second amplifier) 104 via the second power-supply circuit 110 and the second transmission line 1052. In the present disclosure, the second power-supply circuit 110 includes the choke inductor 1101 and a capacitor 1102.

The choke inductor 1101 is electrically connected in series between the second end of the second transmission line 1052 of the hybrid coupler 105 and the power-supply terminal VT of the front-end module. The choke inductor 1101 is electrically connected at a first end to the second end of the second transmission line 1052 of the hybrid coupler 105. The choke inductor 1101 is electrically connected at a second end to the power-supply terminal VT of the front-end module with the power-supply line 20 interposed therebetween. The power-supply voltage Vcc is applied to the peaking amplifier (second amplifier) 104 via the choke inductor 1101 and the second transmission line 1052 of the hybrid coupler 105.

The capacitor 1102 is electrically connected to the second end of the choke inductor 1101 at one end and is electrically connected to the reference potential (GND potential) at the other end.

The input matching network 107 is configured to match the impedance on the input side of the power amplifier 1 and the impedance of the first-stage amplifier 101. The output matching network 106 is configured to match the impedance on the second end of the first transmission line 1051 and the impedance on the output side of the power amplifier 1. The sixth RF signal RF6 is output as a radio-frequency output signal RFout via the output matching network 106.

Figure 3:
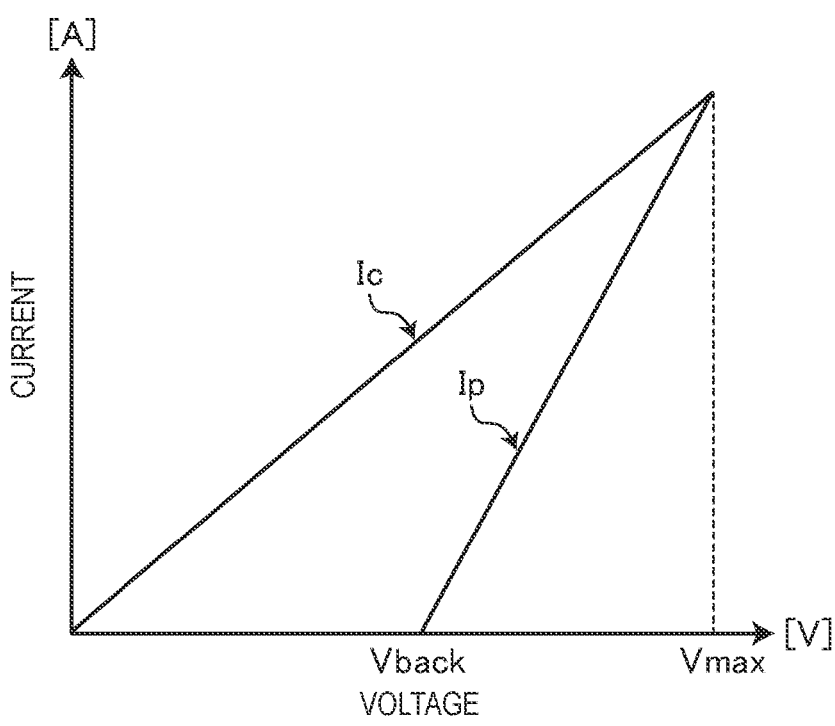
FIG. 3 illustrates an example of operational characteristics of a carrier amplifier and a peaking amplifier in a Doherty amplification circuit.

Referring to FIG. 3, description will be given herein with regard to operational characteristics of the carrier amplifier (first amplifier) 103 and the peaking amplifier (second amplifier) 104 in the power amplifier 1. FIG. 3 illustrates an example of operational characteristics of a carrier amplifier and a peaking amplifier in a Doherty amplification circuit.

In FIG. 3, the horizontal axis represents the voltage [V] of the radio-frequency input signal RFin, and the vertical axis represents the current [A] of the carrier amplifier (first amplifier) 103 and the current of the peaking amplifier (second amplifier) 104. In the example illustrated in FIG. 3, the change in the current of the carrier amplifier (first amplifier) 103 is represented by a line Ic, and the change in the current of the peaking amplifier (second amplifier) 104 is represented by a line Ip.

In the configuration of the power amplifier 1 described above, the carrier amplifier (first amplifier) 103 operates regardless of the voltage level of the radio-frequency input signal RFin. In other words, the carrier amplifier (first amplifier) 103 operates when the radio-frequency input signal RFin is at a level above zero (first level).

The peaking amplifier (second amplifier) 104 operates when the voltage level of the radio-frequency input signal RFin is equal to Vback (second level) or higher, where Vback is lower than the maximum level Vmax by a certain level (for example 3 [dB]).

Operation is referred to as back-off operation while the carrier amplifier (first amplifier) 103 only operates and is referred to as peak operation while the carrier amplifier (first amplifier) 103 and the peaking amplifier (second amplifier) 104 operate.

The chip device 3 including the main circuit blocks of the power amplifier 1 is a heterojunction bipolar transistor (HBT) device (integrated circuit (IC)) formed of heterojunction bipolar transistors made of, for example, a gallium arsenide (GaAs) system. FIG. 2 illustrates an example in which the die of the chip device 3 includes the carrier amplifier (first amplifier) 103, the peaking amplifier (second amplifier) 104, and the hybrid coupler 105. The chip device 3 is mounted to the substrate 2 of the front-end module through bump bonding using, for example, copper pillars.

In the configuration of the power amplifier 1 according to the first embodiment, a first terminal VT1 is to be electrically connected to the first power-supply circuit 109 (choke inductor 1091) on the substrate 2 of the front-end module. When the chip device 3 is mounted to the substrate 2 of the front-end module, the first terminal VT1 is bonded through bump bonding using, for example, copper pillars, and the first terminal VT1 is connected to the second end of the first transmission line 1051 of the hybrid coupler 105 included in the chip device 3.

In the configuration of the power amplifier 1 according to the first embodiment, a second terminal VT2 is to be electrically connected to the second power-supply circuit 110 (choke inductor 1101) on the substrate 2 of the front-end module. When the chip device 3 is mounted to the substrate 2 of the front-end module, the second terminal VT2 is bonded through bump bonding using, for example, copper pillars, and the second terminal VT2 is connected to the second end of the second transmission line 1052 of the hybrid coupler 105 included in the chip device 3.

In the first embodiment, the first terminal VT1 also serves as an output terminal for the sixth RF signal RF6 that is output from the chip device 3 to the output matching network 106. Namely, in the first embodiment, the first terminal VT1 serves not only as the power-supply terminal for supplying the power-supply voltage Vcc to the carrier amplifier (first amplifier) 103 included in the chip device 3 but also as the output terminal for the sixth RF signal RF6 that is output from the chip device 3.

In the example illustrated in FIG. 2, the substrate 2 is a laminated multilayer substrate having multiple wiring layers interleaved with insulating layers. The chip device 3 has a laminated multilayer structure formed of multiple wiring layers and semiconductor layers interleaved with dielectric layers. In the present disclosure, the first transmission line 1051 and the second transmission line 1052 of the hybrid coupler 105 are formed of striplines or microstriplines with a dielectric layer interposed therebetween in the chip device 3.

In the example illustrated in FIG. 2, the hybrid coupler 105 has a form elongated in one direction. More specifically, in the example illustrated in FIG. 2, the hybrid coupler 105 has a form elongated in the X direction.

Figure 4:
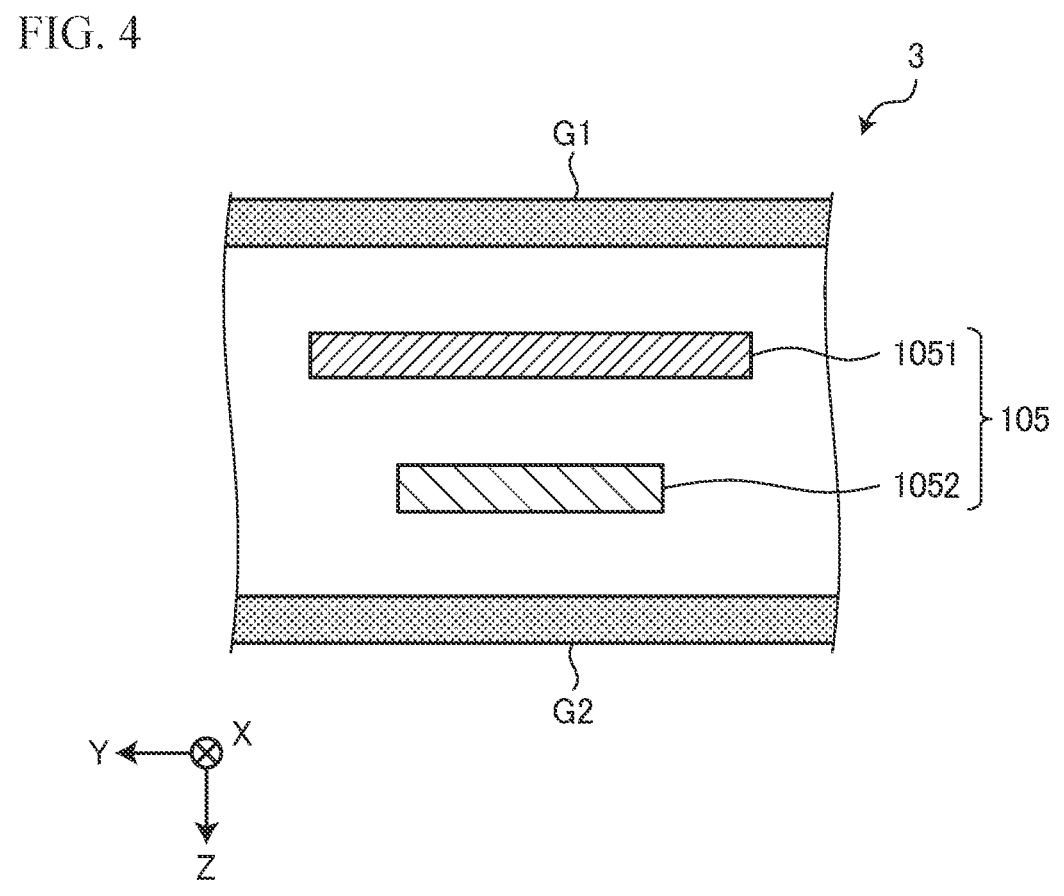

In the hybrid coupler 105, the direction of the current flowing through the first transmission line 1051 while the power-supply voltage Vcc is supplied to the carrier amplifier (first amplifier) 103 differs by 180 degrees from the direction of the current flowing through the second transmission line 1052 while the power-supply voltage Vcc is supplied to the peaking amplifier (second amplifier) 104. FIG. 4 is a cross-sectional view of the hybrid coupler 105 in the YZ plane.

As illustrated in FIG. 4, the hybrid coupler 105 is disposed in an inner layer of the chip device 3. Each layer of the chip device 3 includes a GND trace. GND traces in the layers are connected to each other using, for example, interstitial via holes (IVHs) and are connected to a grounding terminal on the chip device 3, for example, through bump bonding.

The first transmission line 1051 and the second transmission line 1052 of the hybrid coupler 105 are disposed between a GND trace G1 and a GND trace G2 with a dielectric layer interposed between the first and second transmission lines 1051 and 1052 in the Z direction. Specifically, for example, as illustrated in FIG. 2, the first transmission line 1051 and the second transmission line 1052 of the hybrid coupler 105 are disposed in a region overlapping the GND trace G1 and the GND trace G2 of the chip device 3 when viewed in the Z direction.

Figure 5:
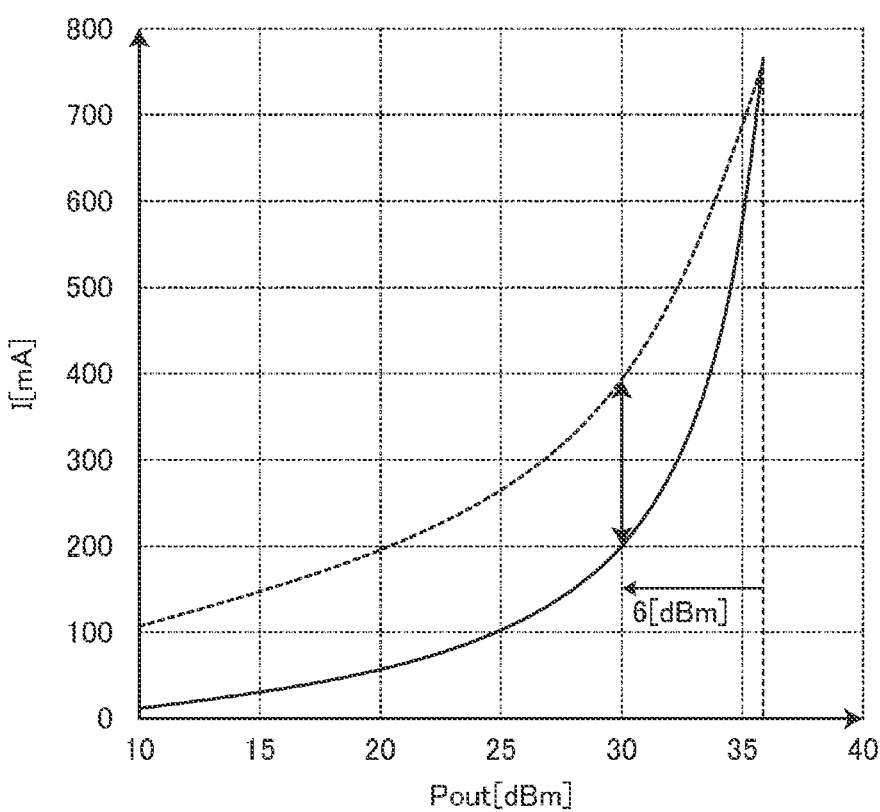
FIG. 5 illustrates an example of characteristics of a direct current flowing through the hybrid coupler.

In the present disclosure, the area of a cross-section of the first transmission line 1051 in the plane (the YZ plane in FIG. 2) perpendicular to the current-flow direction of the first transmission line 1051 (the direction in which the hybrid coupler 105 extends (X direction) in the example illustrated in FIG. 2) is set larger than the area of a cross-section of the second transmission line 1052 in the plane (the YZ plane in FIG. 2) perpendicular to the current-flow direction of the second transmission line 1052 (the direction in which the hybrid coupler 105 extends (X direction) in the example illustrated in FIG. 2). FIG. 5 illustrates an example of characteristics of a direct current flowing through a hybrid coupler. The horizontal axis in FIG. 5 represents the output power (Pout) of the Doherty amplification circuit, and the vertical axis represents direct currents I supplied to respective amplifiers. The dashed line illustrated in FIG. 5 represents an example of characteristics of a direct current flowing through the carrier amplifier, and the solid line represents an example of characteristics of a direct current flowing through the peaking amplifier.

A Doherty amplification circuit typically has a configuration capable of highly efficient operation when a radio-frequency signal having a high peak-to-average power ratio (PAPR) is amplified. Accordingly, the Doherty amplification circuit operates at a back-off level (a state in which the peaking amplifier does not operate or the input and output levels are low) in average power operation, and thus the relationship between the magnitudes of direct currents supplied to the respective amplifiers from the power supply via the hybrid coupler is given as (the current to the peaking amplifier)≤(the current to the carrier amplifier), as illustrated in FIG. 5.

In the example illustrated in FIG. 5, the direct current supplied to the peaking amplifier is approximately half the direct current supplied to the carrier amplifier at the back-off level (around Pout=30 [dBm]), which is approximately 6 [dBm] lower than the saturated output level (around Pout=36 [dBm]). Although the direct current supplied to the carrier amplifier is approximately equal to the direct current supplied to the peaking amplifier at the saturated output level, a radio-frequency signal is not typically amplified at the saturated output level.

Thus, in the present disclosure, as described above, the area of a cross-section of the first transmission line 1051 in the plane perpendicular to the current-flow direction of the first transmission line 1051 is set larger than the area of a cross-section of the second transmission line 1052 in the plane perpendicular to the current-flow direction of the second transmission line 1052. Specifically, the area of the cross-section of the first transmission line 1051 in the plane perpendicular to the current-flow direction of the first transmission line 1051 and the area of the cross-section of the second transmission line 1052 in the plane perpendicular to the current-flow direction of the second transmission line 1052 are optimized based on the amount of current flowing through the first transmission line 1051 and the amount of current flowing through the second transmission line 1052 in the hybrid coupler 105. In this way, the chip device 3, which includes the main circuit blocks of the power amplifier 1 including the hybrid coupler 105, may be downsized more than in the case where the area of the cross section of the first transmission line 1051 is made equal to the area of the cross section of the second transmission line 1052.

Figure 6:
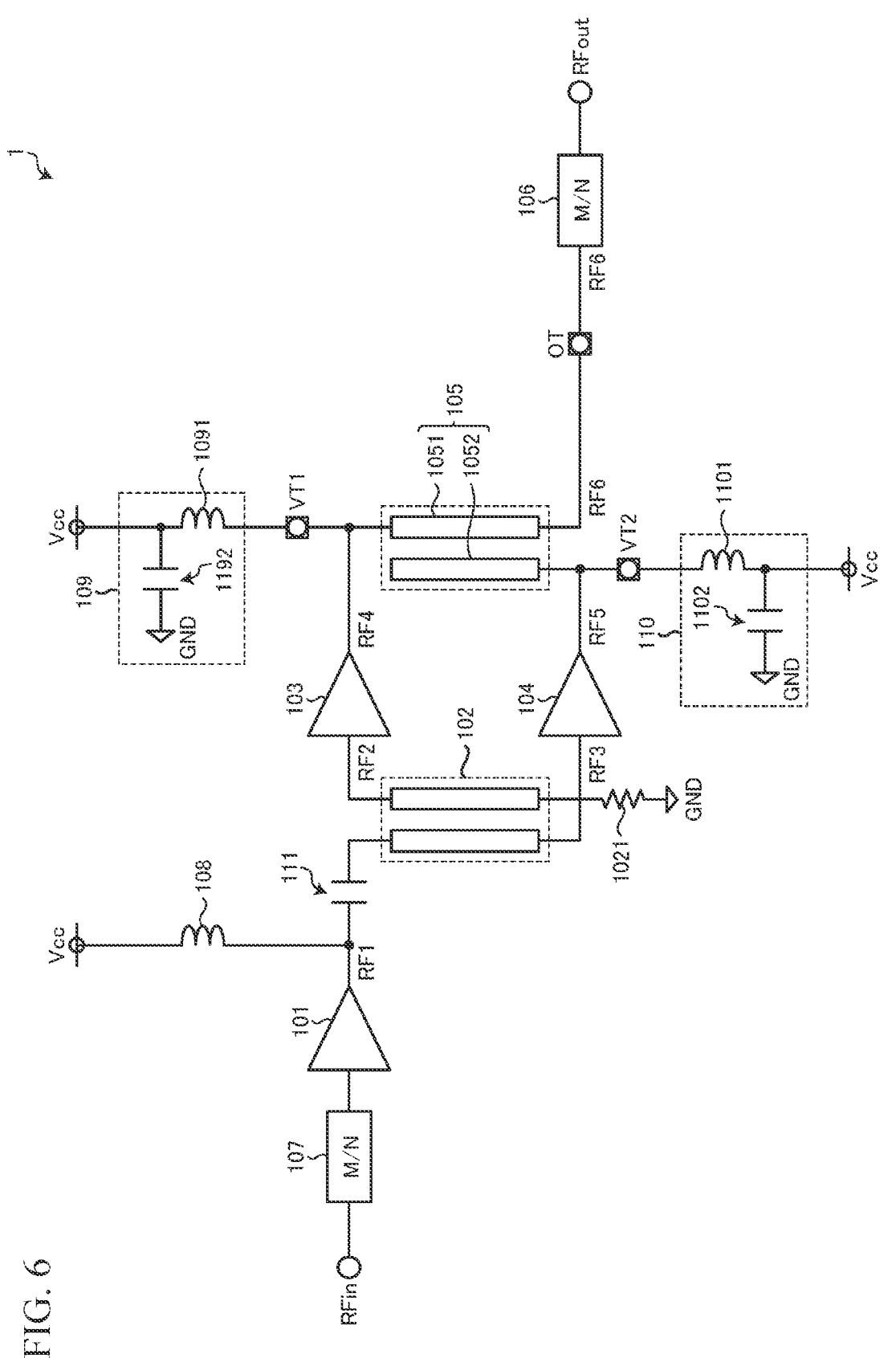
FIG. 6 illustrates an example of a configuration of a power amplifier according to a comparative example.
Figure 7:
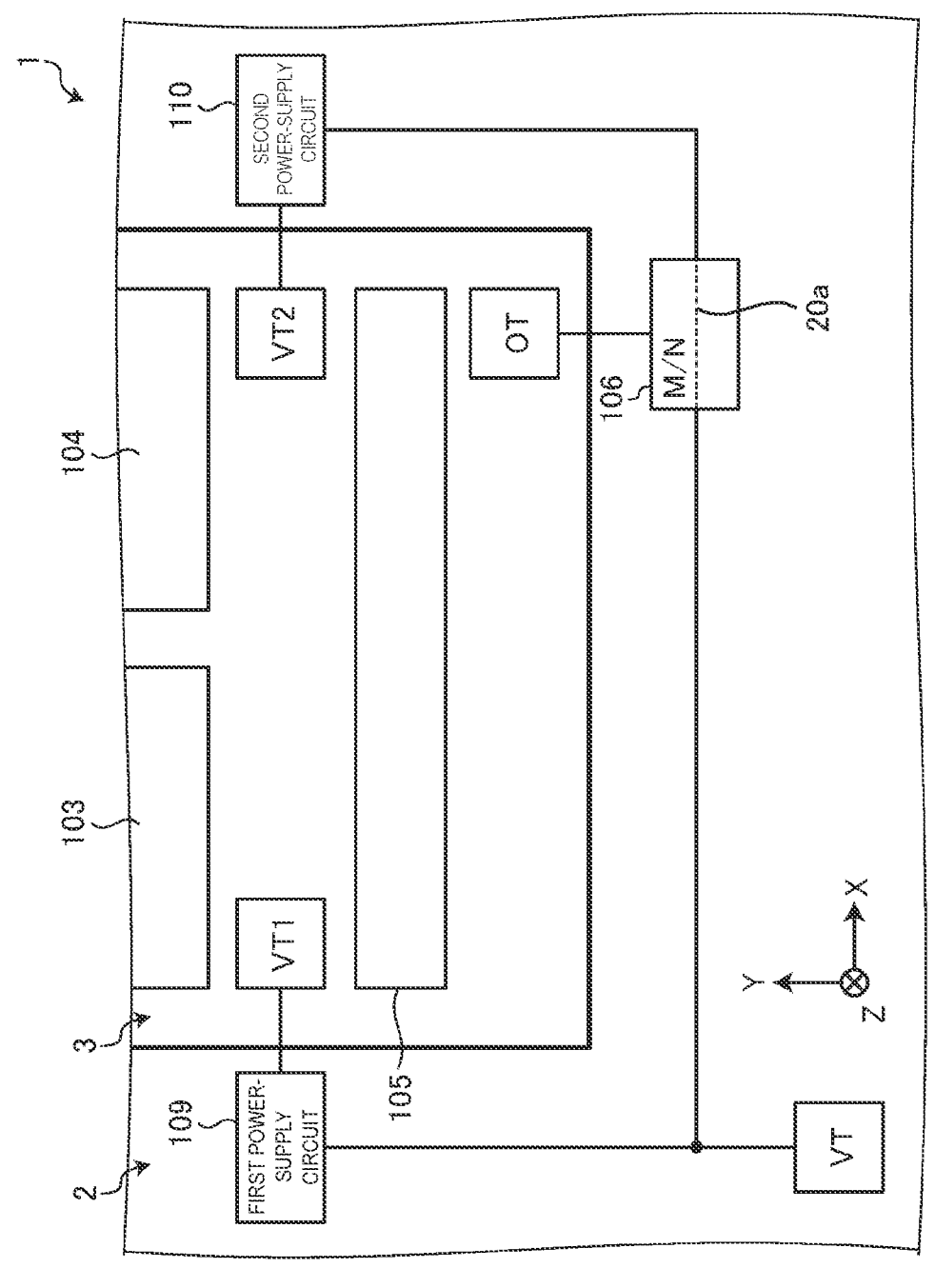
FIG. 7 is a conceptual plan view illustrating an example of an arrangement of main circuit blocks included in a chip device of the power amplifier according to the comparative example on a substrate of a front-end module.

FIG. 6 illustrates an example of a configuration of a power amplifier according to a comparative example. FIG. 7 is a conceptual plan view illustrating an example of an arrangement of main circuit blocks included in a chip device of the power amplifier according to the comparative example on a substrate of a front-end module. Configurations that are similar to the configurations in the first embodiment will not be described in detail.

In the comparative example illustrated in FIG. 6 and FIG. 7, a first terminal VT1 is connected to a first end of a first transmission line 1051, which is connected to a carrier amplifier (first amplifier) 103, of a hybrid coupler 105. A second terminal VT2 is connected to a first end of a second transmission line 1052, which is connected to a peaking amplifier (second amplifier) 104, of the hybrid coupler 105, and a second end of the second transmission line 1052 is open. In the configuration according to the comparative example, an output terminal OT is disposed for a sixth RF signal RF6 that is output from a chip device 3 to an output matching network 106.

In the comparative example, as illustrated in FIG. 7, the first terminal VT1 and the second terminal VT2 are symmetrically disposed one each near both end portions of the hybrid coupler 105 in the X direction between the hybrid coupler 105 and the outputs of the carrier amplifier (first amplifier) 103 and the peaking amplifier (second amplifier)

104. In addition, in the configuration according to the comparative example, as illustrated in FIG. 7, the output terminal OT is disposed on the other side of the hybrid coupler 105 from the first terminal VT1 and the second terminal VT2. In the configuration according to the comparative example, to form a connection between a second power-supply circuit 110 (choke inductor 1101), which is connected to the second terminal VT2, and a power-supply terminal VT of the front-end module disposed on a substrate 2, a power-supply line 20a needs to be laid over the output matching network 106 in the Z direction or needs to detour around the output matching network 106 and a supply path to the chip device 3 for a radio-frequency input signal RFin. If the power-supply line 20a is laid over the output matching network 106 in the Z direction, electromagnetic coupling occurs between the power-supply line 20a and the output matching network 106, leading to performance degradation. If the power-supply line 20a detours around the output matching network 106 and the supply path to the chip device 3 for the radio-frequency input signal RFin, the wiring on the substrate 2 of the front-end module may become complicated, and downsizing the front-end module may be hampered.

In the configuration according to the first embodiment illustrated in FIG. 1 and FIG. 2, as described above, the first terminal VT1 also serves as the output terminal for the sixth RF signal RF6 that is output from the chip device 3 to the output matching network 106. Consequently, the power-supply line 20 need not be laid over the output matching network 106 to form a connection between the first power-supply circuit 109 (choke inductor 1091), which is connected to the first terminal VT1, and the power-supply terminal VT of the front-end module disposed on the substrate 2. Thus, the possibility of performance degradation due to electromagnetic coupling between the power-supply line 20 and the output matching network 106 may be reduced. Further, for example, the power-supply line 20 need not detour around the output matching network 106 and a supply path to the chip device 3 for the radio-frequency input signal RFin, and complicated wiring may be avoided. Thus, impediments to downsizing the front-end module may be reduced.

In addition, in the configuration according to the first embodiment illustrated in FIG. 1 and FIG. 2, the first terminal VT1 and the second terminal VT2 are respectively connected to the second end of the first transmission line 1051 and the second end of the second transmission line 1052 as described above. In other words, the power-supply voltage Vcc is supplied to the carrier amplifier (first amplifier) 103 via the first transmission line 1051, and the power-supply voltage Vcc is supplied to the peaking amplifier (second amplifier) 104 via the second transmission line 1052. Consequently, the first terminal VT1 and the second terminal VT2 need not be disposed between the hybrid coupler 105 and the outputs of the carrier amplifier (first amplifier) 103 and the peaking amplifier (second amplifier) 104. Thus, degradation of characteristics may be reduced because the carrier amplifier (first amplifier) 103, the peaking amplifier (second amplifier) 104, and the hybrid coupler 105 may be connected using relatively short traces, reducing the generation of parasitic inductance.

First Modification

Figure 8:
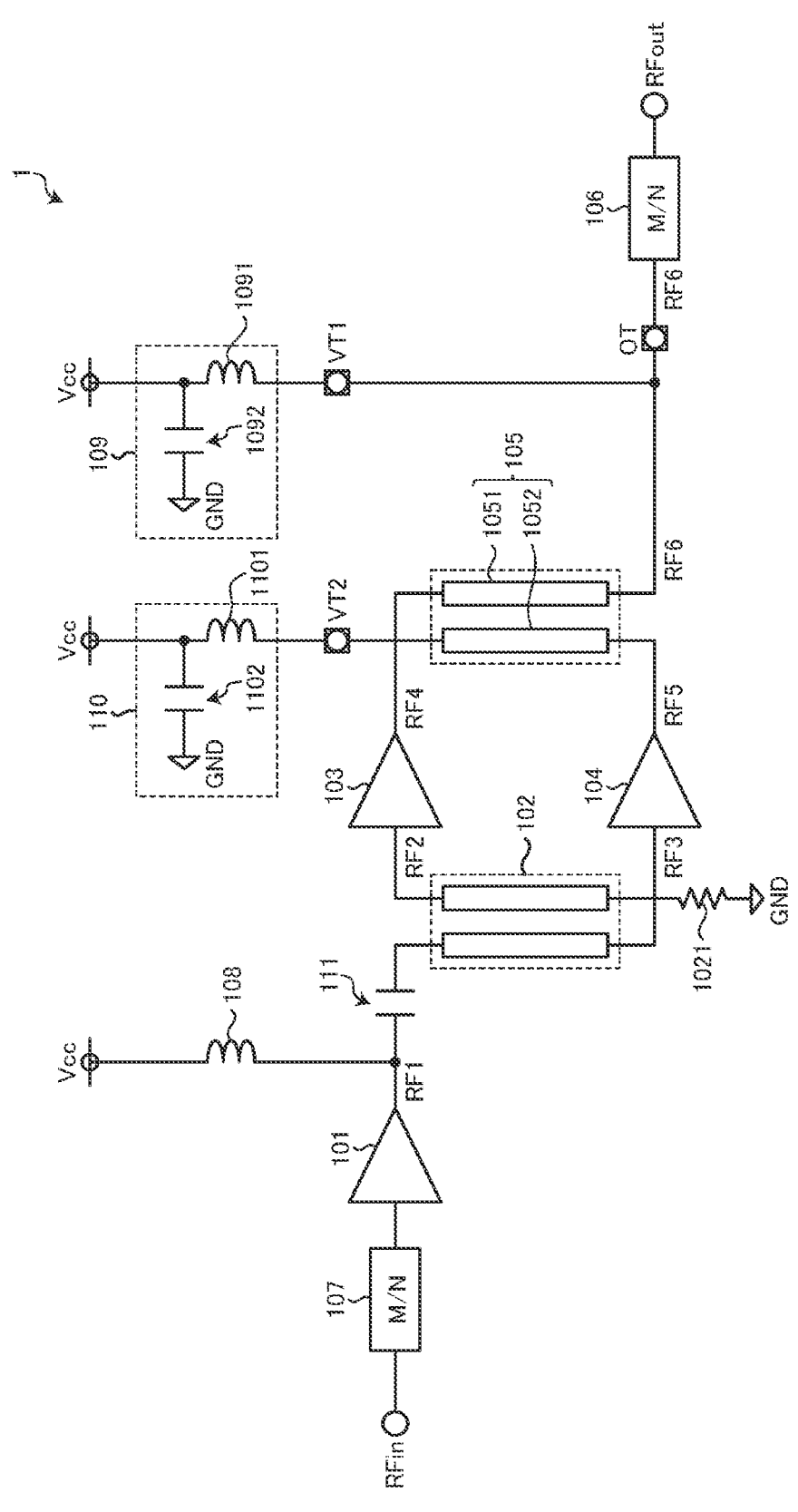
FIG. 8 illustrates an example of a configuration of a power amplifier according to a first modification to the first embodiment.
Figure 9:
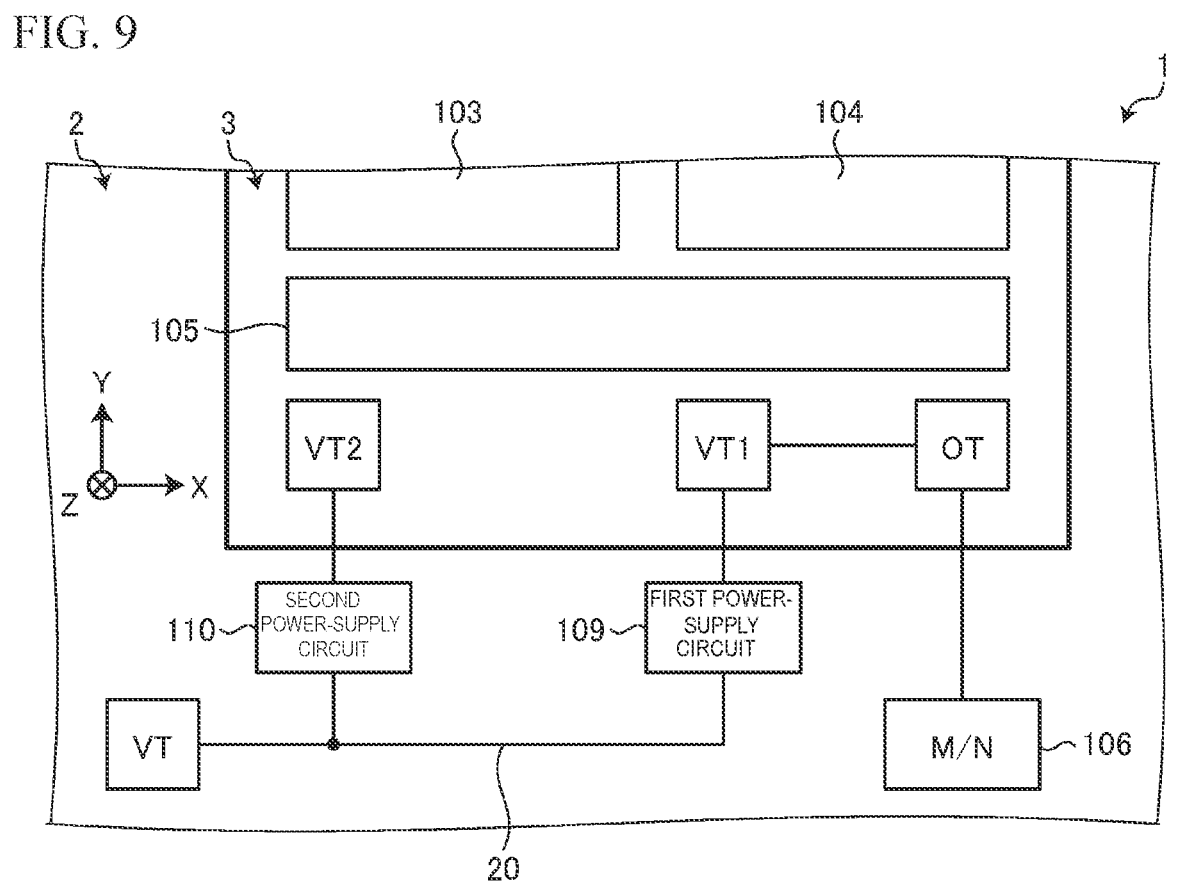

FIG. 8 illustrates an example of a configuration of a power amplifier according to a first modification to the first embodiment. FIG. 9 is a conceptual plan view illustrating an example of an arrangement of main circuit blocks included in a chip device of the power amplifier according to the first modification to the first embodiment on a substrate of a front-end module. Configurations that are similar to the configurations in the first embodiment will not be described in detail.

In the configuration illustrated in FIG. 8 and FIG. 9 according to the first modification to the first embodiment, as in the configuration illustrated in FIG. 1 and FIG. 2 according to the first embodiment, the hybrid coupler 105 is configured to receive at the first end of the first transmission line 1051 the fourth RF signal RF4 that is output from the carrier amplifier (first amplifier) 103, and the power-supply voltage Vcc is supplied to the second end of the first transmission line 1051 via the first power-supply circuit 109.

In the first modification to the first embodiment, the first terminal VT1 does not serve as the output terminal for the sixth RF signal RF6 that is output from the chip device 3 to the output matching network 106, and the first terminal VT1 connected to the first power-supply circuit 109 and an output terminal OT for the sixth RF signal RF6 that is output from the chip device 3 to the output matching network 106 are disposed at the second end of the first transmission line 1051. In other words, the output terminal OT is disposed on a signal output line for the sixth RF signal RF6 that is output from the first transmission line 1051 to the output matching network 106.

In the configuration according to the first modification to the first embodiment, as illustrated in FIG. 9, the output terminal OT is disposed on the same side of the hybrid coupler 105 as the first terminal VT1 and the second terminal VT2. Since the output terminal OT is not disposed between the first terminal VT1 and the second terminal VT2 in the configuration, the power-supply line 20 need not be laid over the output matching network 106 to form a connection between the first power-supply circuit 109 (choke inductor 1091), which is connected to the first terminal VT1, and the power-supply terminal VT of the front-end module disposed on the substrate 2. Thus, the possibility of performance degradation due to electromagnetic coupling between the power-supply line 20 and the output matching network 106 may be reduced as in the first embodiment. Further, for example, the power-supply line 20 need not detour around the output matching network 106 and a supply path to the chip device 3 for the radio-frequency input signal RFin, and complicated wiring may be avoided as in the first embodiment. Thus, impediments to downsizing the front-end module may be reduced.

Second Modification

Figure 10:
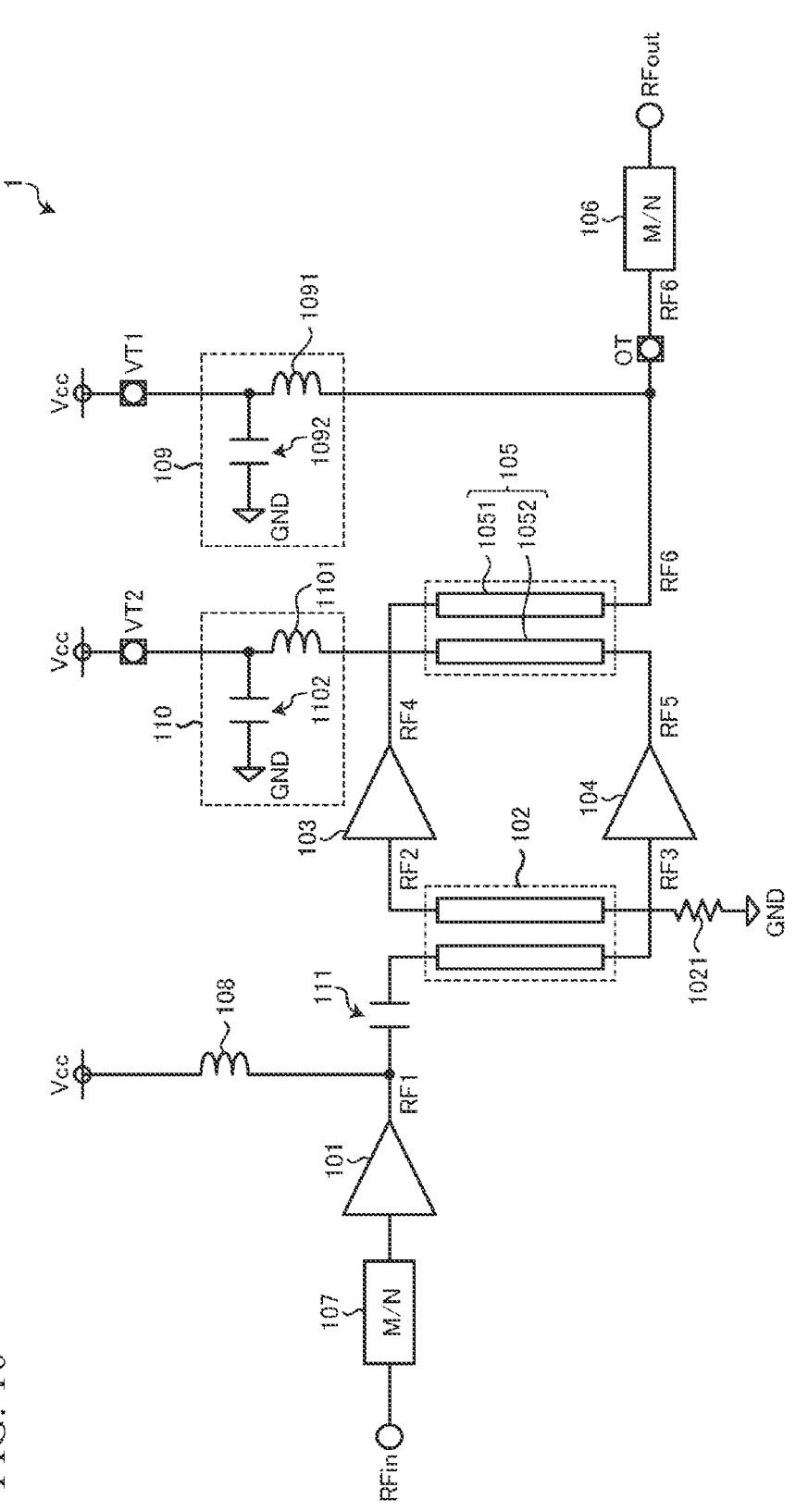
FIG. 10 illustrates an example of a configuration of a power amplifier according to a second modification to the first embodiment.
Figure 11:
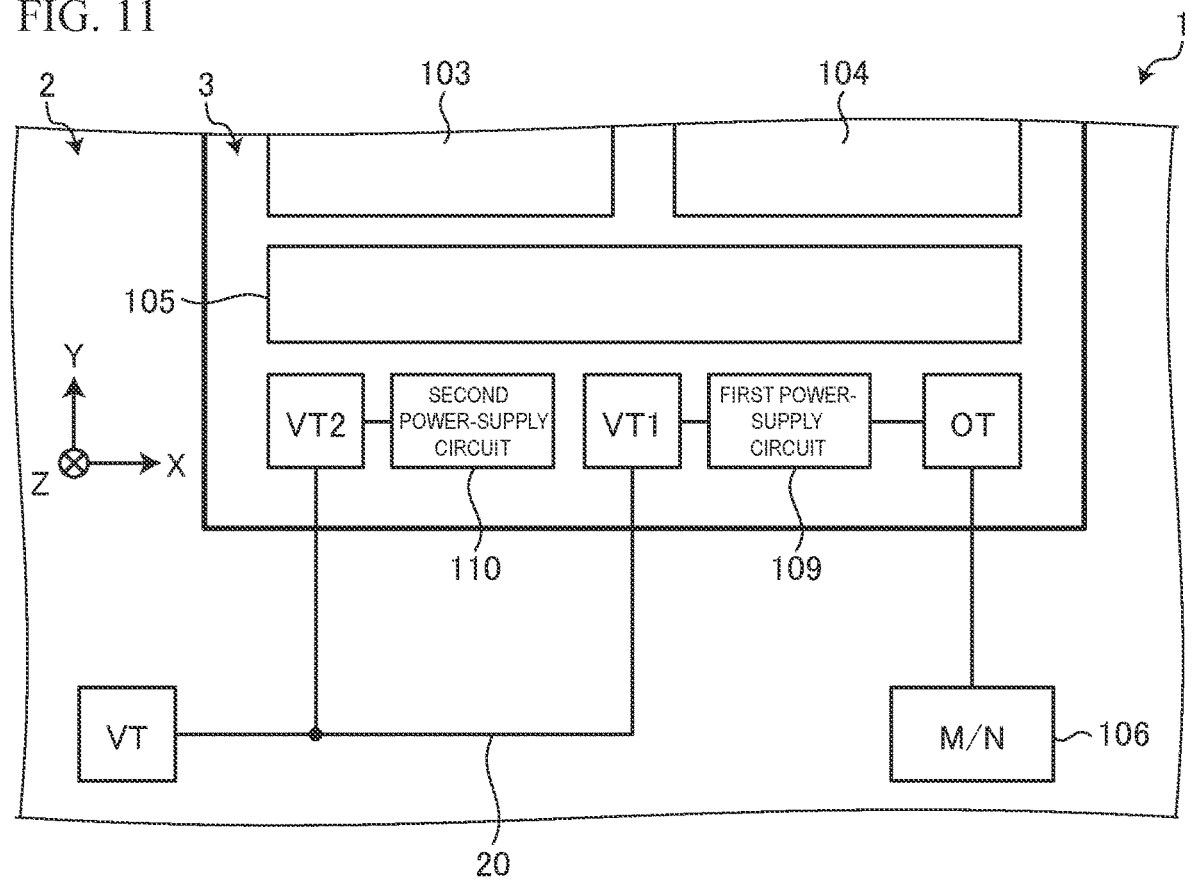
FIG. 11 is a conceptual plan view illustrating an example of an arrangement of main circuit blocks included in a chip device of the power amplifier according to the second modification to the first embodiment on a substrate of a front-end module.

FIG. 10 illustrates an example of a configuration of a power amplifier according to a second modification to the first embodiment. FIG. 11 is a conceptual plan view illustrating an example of an arrangement of main circuit blocks included in a chip device of the power amplifier according to the second modification to the first embodiment on a substrate of a front-end module. Configurations that are similar to the configurations in the first embodiment and the first modification will not be described in detail.

In an example of the configuration illustrated in FIG. 10 and FIG. 11 according to the second modification to the first embodiment, the first power-supply circuit 109 (choke inductor 1091) and the second power-supply circuit 110 (choke inductor 1101) are disposed on the die of the chip device 3. The choke inductor 1091 and the choke inductor 1101 are formed of, for example, traces in the chip device 3.

In the second modification to the first embodiment, the first terminal VT1 is connected to the power-supply terminal VT of the front-end module with the power-supply line 20 interposed therebetween. The power-supply voltage Vcc supplied to the first terminal VT1 is supplied to the carrier amplifier (first amplifier) 103 via the first power-supply circuit 109 (choke inductor 1091) disposed on the die of the chip device 3 and the first transmission line 1051 of the hybrid coupler 105.

The second terminal VT2 is connected to the power-supply terminal VT of the front-end module with the power-supply line 20 interposed therebetween. The power-supply voltage Vcc supplied to the second terminal VT2 is supplied to the peaking amplifier (second amplifier) 104 via the second power-supply circuit 110 (choke inductor 1101) disposed on the die of the chip device 3 and the second transmission line 1052 of the hybrid coupler 105.

In the configuration according to the second modification to the first embodiment illustrated in FIG. 10 and FIG. 11, the first terminal VT1 is disposed on a second end of the first power-supply circuit 109 (choke inductor 1091). The output terminal OT is disposed at the connection point between the second end of the first transmission line 1051 and a first end of the first power-supply circuit 109 (choke inductor 1091). In other words, the output terminal OT is disposed on a signal output line for the sixth RF signal RF6 that is output from the first transmission line 1051 to the output matching network 106.

Since the output terminal OT is not disposed between the first terminal VT1 and the second terminal VT2 as illustrated in FIG. 11 in the configuration according to the second modification to the first embodiment, the power-supply line 20 need not be laid over the output matching network 106 to form a connection between the first terminal VT1 and the power-supply terminal VT of the front-end module disposed on the substrate 2. Thus, the possibility of performance degradation due to electromagnetic coupling between the power-supply line 20 and the output matching network 106 may be reduced as in the first embodiment and the first modification. Further, for example, the power-supply line 20 need not detour around the output matching network 106 and a supply path to the chip device 3 for the radio-frequency input signal RFin, and complicated wiring may be avoided as in the first embodiment and the first modification. Thus, impediments to downsizing the front-end module may be reduced.

Second Embodiment

Figure 12:
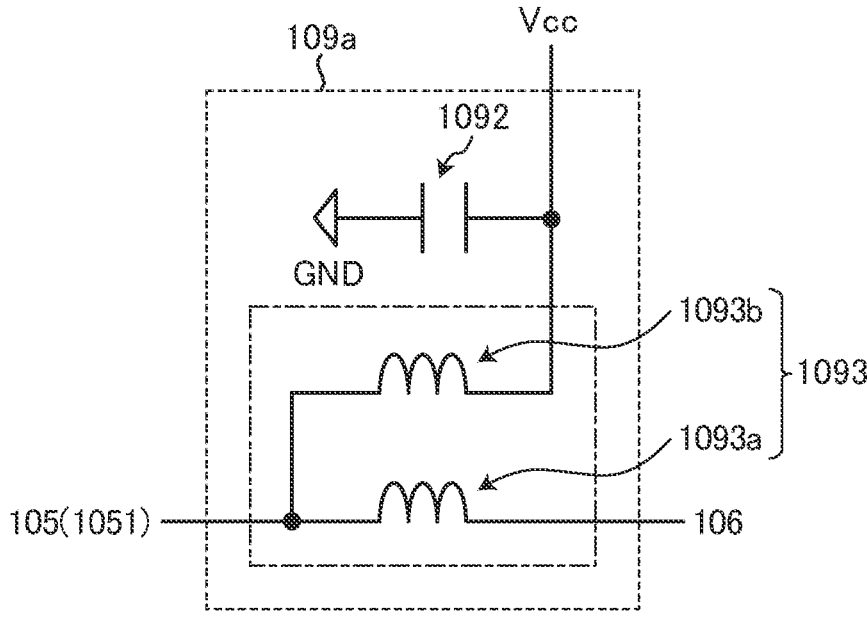
FIG. 12 illustrates an example of a first power-supply circuit of a power amplifier according to a second embodiment.

FIG. 12 illustrates an example of a first power-supply circuit of a power amplifier according to a second embodiment. Configurations other than a first power-supply circuit 109a are the same as or similar to the configurations in the first embodiment and will not be described in detail herein.

As illustrated in FIG. 12, the first power-supply circuit 109a according to the second embodiment is an autotransformer matching network including an autotransformer 1093 and a capacitor 1092.

The autotransformer 1093 includes a first winding 1093a and a second winding 1093b. The first winding 1093a and the second winding 1093b are electrically connected in series.

The first winding 1093a is electrically connected in series between the second end of the first transmission line 1051 of the hybrid coupler 105 and the output matching network 106. The first winding 1093a is electrically connected at a first end to the second end of the first transmission line 1051 of the hybrid coupler 105. The first winding 1093a is electrically connected at a second end to the output matching network 106. The sixth RF signal RF6 that is output from the second end of the first transmission line 1051 is output to the output matching network 106 via the first winding 1093a of the autotransformer 1093.

The second winding 1093b is electrically connected in series between the power-supply terminal VT of the front-end module and the connection point between the first end of the first winding 1093a and the second end of the first transmission line 1051 of the hybrid coupler 105. The second winding 1093b is electrically connected at a first end to the connection point between the first end of the first winding 1093a and the second end of the first transmission line 1051 of the hybrid coupler 105. The second winding 1093b is electrically connected at a second end to the power-supply terminal VT of the front-end module with the power-supply line 20 interposed therebetween. The power-supply voltage Vcc is applied to the carrier amplifier (first amplifier) 103 via the second winding 1093b of the auto-transformer 1093 and the first transmission line 1051 of the hybrid coupler 105.

The capacitor 1092 is electrically connected at one end to the second end of the second winding 1093b of the auto-transformer 1093 and is electrically connected at the other end to the reference potential (GND potential).

Such a configuration allows the first power-supply circuit 109a to include part of a component of the output matching network 106 at the subsequent stage. Specifically, for example, the first winding 1093a of the autotransformer 1093 may be designed as part of a component of the output matching network 106. In this way, downsizing the front-end module to which the chip device 3 is mounted becomes possible.

Third Embodiment

Figure 13:
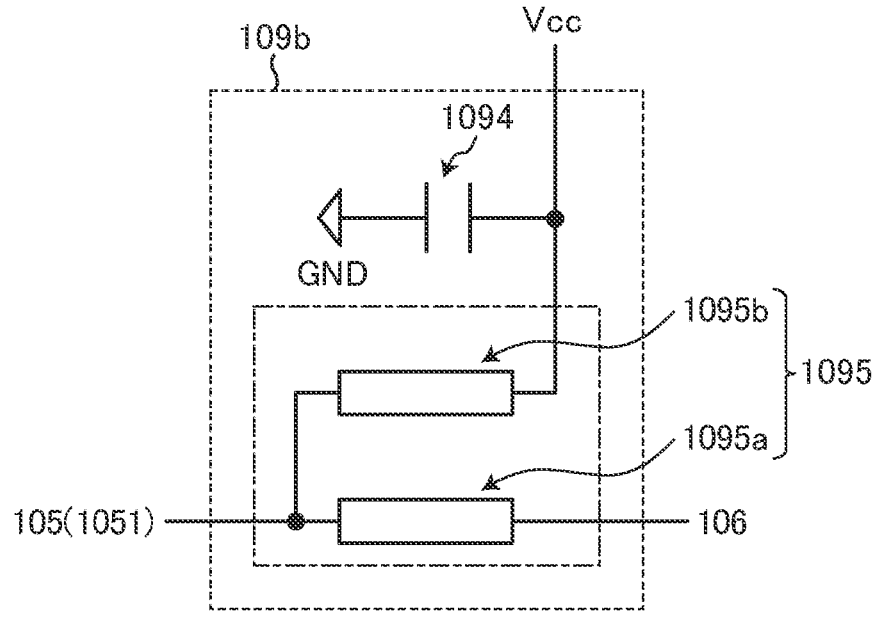
FIG. 13 illustrates an example of a first power-supply circuit of a power amplifier according to a third embodiment.

FIG. 13 illustrates an example of a first power-supply circuit of a power amplifier according to a third embodiment. Configurations other than a first power-supply circuit 109b are the same as or similar to the configurations in the first embodiment and the second embodiment and will not be described in detail herein.

As illustrated in FIG. 13, the first power-supply circuit 109b according to the third embodiment is a transmission-line matching network including a transmission-line transformer (TLT) 1095 and a capacitor 1094. The first power-supply circuit 109b according to the third embodiment has the same configuration as the first power-supply circuit 109a according to the second embodiment except that the auto-transformer 1093 is replaced by the transmission-line transformer 1095.

The transmission-line transformer 1095 includes a first line 1095a and a second line 1095b. The first line 1095a and the second line 1095b are electrically connected in series.

The first line 1095a is electrically connected in series between the second end of the first transmission line 1051 of the hybrid coupler 105 and the output matching network 106. The first line 1095a is electrically connected at a first end to the second end of the first transmission line 1051 of the hybrid coupler 105. The first line 1095a is electrically connected at a second end to the output matching network 106. The sixth RF signal RF6 that is output from the second end of the first transmission line 1051 is output to the output matching network 106 via the first line 1095a of the transmission-line transformer 1095.

The second line 1095b is electrically connected in series between the power-supply terminal VT of the front-end module and the connection point between the first end of the first line 1095a and the second end of the first transmission line 1051 of the hybrid coupler 105. The second line 1095b is electrically connected at a first end to the connection point between the first end of the first line 1095a and the second end of the first transmission line 1051 of the hybrid coupler 105. The second line 1095b is electrically connected at a second end to the power-supply terminal VT of the front-end module with the power-supply line 20 interposed therebetween. The power-supply voltage Vcc is applied to the carrier amplifier (first amplifier) 103 via the second line 1095b of the transmission-line transformer 1095 and the first transmission line 1051 of the hybrid coupler 105.

The capacitor 1094 is electrically connected at one end to the second end of the second line 1095b of the transmission-line transformer 1095 and is electrically connected at the other end to the reference potential (GND potential).

Such a configuration allows the first power-supply circuit 109b to include part of a component of the output matching network 106 at the subsequent stage. Specifically, for example, the first line 1095a of the transmission-line transformer 1095 may be designed as part of a component of the output matching network 106. In this way, downsizing the front-end module to which the chip device 3 is mounted becomes possible.

Fourth Embodiment

Figure 14:
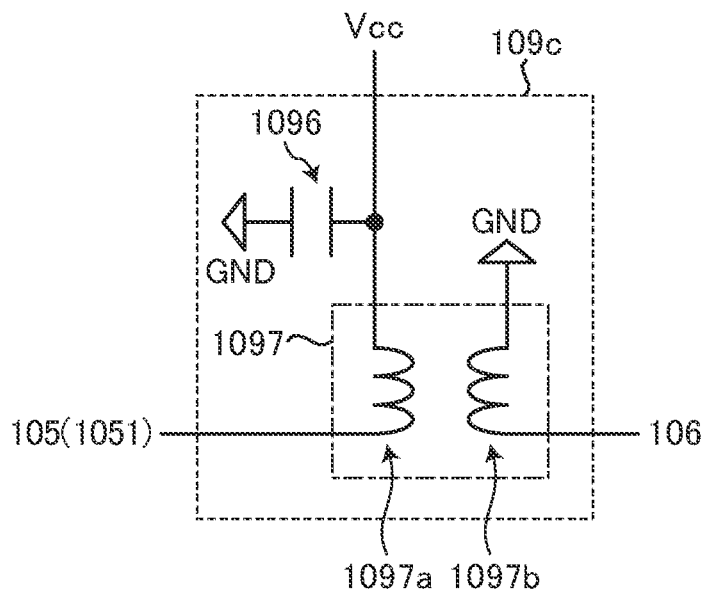
FIG. 14 illustrates an example of a first power-supply circuit of a power amplifier according to a fourth embodiment.

FIG. 14 illustrates an example of a first power-supply circuit of a power amplifier according to a fourth embodiment. Configurations other than a first power-supply circuit 109c are the same as or similar to the configurations in the embodiments described above and will not be described in detail herein.

As illustrated in FIG. 14, the first power-supply circuit 109c according to the fourth embodiment is a conventional transformer matching network including a conventional transformer 1097 and a capacitor 1096.

The conventional transformer 1097 includes a primary winding 1097a and a secondary winding 1097b. The primary winding 1097a and the secondary winding 1097b have a winding ratio 1:n and are magnetically coupled to each other, and the conventional transformer 1097 is configured to provide impedance transformation with a transformation ratio of $1:n^2$. The primary winding 1097a is electrically connected in series between the second end of the first transmission line 1051 of the hybrid coupler 105 and the power-supply terminal VT of the front-end module. The primary winding 1097a is electrically connected at a first end to the second end of the first transmission line 1051 of the hybrid coupler 105. The primary winding 1097a is electrically connected at a second end to the power-supply terminal VT of the front-end module with the power-supply line 20 interposed therebetween. The power-supply voltage Vcc is applied to the carrier amplifier (first amplifier) 103 via the primary winding 1097a of the conventional transformer 1097 and the first transmission line 1051 of the hybrid coupler 105.

The secondary winding 1097b is electrically connected in series between the reference potential (GND potential) and the output matching network 106. The secondary winding 1097b is electrically connected to the output matching network 106 at a first end. The secondary winding 1097b is electrically connected to the reference potential (GND potential) at a second end. The sixth RF signal RF6 that is output from the second end of the first transmission line 1051 is output to the output matching network 106 via the conventional transformer 1097.

The capacitor 1096 is electrically connected at one end to the second end of the primary winding 1097a of the conventional transformer 1097 and is electrically connected at the other end to the reference potential (GND potential).

Such a configuration allows the first power-supply circuit 109c to include part of a component of the output matching network 106 at the subsequent stage. Specifically, for example, the secondary winding 1097b of the conventional transformer 1097 may be designed as part of a component of the output matching network 106. In this way, downsizing the front-end module to which the chip device 3 is mounted becomes possible.

In the embodiments and the modifications described above, the configurations in which the power-supply circuits include a capacitor have been illustrated as non-limiting examples.

The embodiments and the modifications described above are provided for easy understanding of the present disclosure and are not intended to limit the present disclosure. Changes and improvements may be made to the present disclosure without necessarily departing from the spirit of the present disclosure, and the equivalents thereof are also encompassed by the present disclosure.

The following configurations are feasible in the present disclosure as described above or instead of the configurations described above.

(1) A power amplifier according to an aspect of the present disclosure comprises: a first amplifier configured to amplify a first high-frequency signal; a second amplifier configured to amplify a second high-frequency signal delayed with respect to the first high-frequency signal by at least 90 degrees; a hybrid coupler including a first transmission line and a second transmission line; a first power-supply circuit configured to supply electric power to the first amplifier; a second power-supply circuit configured to supply the electric power to the second amplifier; and an output matching network, wherein the hybrid coupler is connected to an output end of the first amplifier at a first end of the first transmission line, connected to the first power-supply circuit and the output matching network at a second end of the first transmission line, connected to an output end of the second amplifier at a first end of the second transmission line, and connected to the second power-supply circuit at a second end of the second transmission line.

In this configuration, a power-supply line to the first transmission line may also serve as a signal output line to the output matching network. As a result, a power supply line to the power amplifier need not be laid over the output matching network. Thus, the possibility of performance degradation due to electromagnetic coupling between the power-supply line and the output matching network may be reduced. Further, for example, the power-supply line need not detour around the output matching network and a supply path to the chip device for the radio-frequency signal, and complicated wiring may be avoided. Thus, impediments to downsizing may be reduced.

(2) The power amplifier according to (1), wherein a chip device is mounted to a substrate and includes the first amplifier, the second amplifier, and the hybrid coupler, and at least a portion of the output matching network is disposed on the substrate, wherein the chip device further includes a first terminal connected to the first power-supply circuit, and a second terminal connected to the second power-supply circuit, and wherein the electric power is supplied to the first terminal and the second terminal from a power-supply terminal disposed on the substrate.

In this configuration, the power-supply line between the power-supply terminal and the first and second terminals need not be laid over the output matching network on the substrate. Consequently, the possibility of performance degradation due to electromagnetic coupling between the power-supply line and the output matching network may be reduced. Further, for example, the power-supply line need not detour around the output matching network and a supply path to the chip device for the radio-frequency signal, and complicated wiring on the substrate may be avoided. This allows downsizing the substrate.

(3) The power amplifier according to (2), wherein the first power-supply circuit and the second power-supply circuit are disposed on the substrate, the electric power is supplied to the first terminal from the power-supply terminal via a power-supply line disposed on the substrate and the first power-supply circuit, and the electric power is supplied to the second terminal from the power-supply terminal via the power-supply line and the second power-supply circuit.

(4) The power amplifier according to (3), wherein the chip device further includes an output terminal, and the output terminal is disposed on a signal output line connecting the first transmission line to the output matching network.

(5) The power amplifier according to (4), wherein the output terminal is disposed on the same side of the hybrid coupler as the first terminal and the second terminal on the substrate.

(6) The power amplifier according to (2), wherein the chip device includes the first power-supply circuit and the second power-supply circuit, the electric power is supplied to the first terminal from the power-supply terminal via a power-supply line disposed on the substrate, and the electric power is supplied to the second terminal from the power-supply terminal via the power-supply line, and wherein the chip device further includes an output terminal, and the output terminal is disposed on a signal output line connecting the first transmission line to the output matching network.

(7) The power amplifier according to any one of (2) to (6), wherein the hybrid coupler included in the chip device includes a dielectric layer interposed between the first transmission line and the second transmission line in a Z direction.

(8) The power amplifier according to (7), wherein, in the hybrid coupler, an area of a cross-section of the first transmission line in a plane perpendicular to a current-flow direction of the first transmission line is larger than an area of a cross-section of the second transmission line in a plane perpendicular to a current-flow direction of the second transmission line.

In this configuration, the area of the cross-section of the first transmission line in the plane perpendicular to the current-flow direction of the first transmission line and the area of the cross-section of the second transmission line in the plane perpendicular to the current-flow direction of the second transmission line are optimized based on the amount of current flowing through the first transmission line and the amount of current flowing through the second transmission line. This allows downsizing the chip device.

(9) The power amplifier according to any one of (2) to (8), wherein the first power-supply circuit includes a choke inductor, and the choke inductor is electrically connected in series between the second end of the first transmission line and the power-supply terminal.

(10) The power amplifier according to any one of (2) to (8), wherein the first power-supply circuit includes an autotransformer including a first winding and a second winding, the first winding is electrically connected in series between the second end of the first transmission line and the output matching network, and the second winding is electrically connected in series between the power-supply terminal and a connection point between a first end of the first winding and the second end of the first transmission line.

Such a configuration allows the first power-supply circuit to include part of a component of the output matching network at the subsequent stage. Specifically, for example, the first winding of the autotransformer may be designed as part of a component of the output matching network. This allows downsizing the substrate.

(11) The power amplifier according to any one of (2) to (8), wherein the first power-supply circuit includes a transmission-line transformer including a first line and a second line, the first line is electrically connected in series between the second end of the first transmission line and the output matching network, and the second line is electrically connected in series between the power-supply terminal and a connection point between a first end of the first winding and the second end of the first transmission line.

Such a configuration allows the first power-supply circuit to include part of a component of the output matching network at the subsequent stage. Specifically, for example, the first line of the transmission-line transformer may be designed as part of a component of the output matching network. This allows downsizing the substrate.

(12) The power amplifier according to any one of (2) to (8), wherein the first power-supply circuit includes a conventional transformer including a primary winding and a secondary winding, the primary winding is electrically connected in series between the second end of the first transmission line and the power-supply terminal, and the secondary winding is electrically connected in series between a reference potential and the output matching network.

Such a configuration allows the first power-supply circuit to include part of a component of the output matching network at the subsequent stage. Specifically, for example, the secondary winding of the conventional transformer may be designed as part of a component of the output matching network. This allows downsizing the substrate.

According to the present disclosure, it is possible to provide a power amplifier having simplified wiring in a module and a mounted device, being downsized, and having improved performance.

What is claimed is:

1. A power amplifier comprising:
   a first amplifier configured to amplify a first high-frequency signal;
   a second amplifier configured to amplify a second high-frequency signal, the second high-frequency signal being delayed with respect to the first high-frequency signal by at least 90 degrees;
   a hybrid coupler comprising a first transmission line and a second transmission line;
   a first power-supply circuit configured to supply electric power to the first amplifier;
   a second power-supply circuit configured to supply the electric power to the second amplifier; and
   an output matching network,
   wherein the hybrid coupler is:
      connected to an output end of the first amplifier at a first end of the first transmission line,
      connected to the first power-supply circuit and the output matching network at a second end of the first transmission line, connected to an output end of the second amplifier at a first end of the second transmission line, and connected to the second power-supply circuit at a second end of the second transmission line.

2. The power amplifier according to claim 1, wherein a chip device is mounted to a substrate, wherein the chip device comprises:

the first amplifier, the second amplifier, and the hybrid coupler, a first terminal connected to the first power-supply circuit, and a second terminal connected to the second power-supply circuit, wherein at least a portion of the output matching network is on the substrate, and wherein the electric power is supplied to the first terminal and the second terminal from a power-supply terminal that is on the substrate.

3. The power amplifier according to claim 2, wherein the first power-supply circuit and the second power-supply circuit are on the substrate, wherein the electric power is supplied to the first terminal from the power-supply terminal via the first power-supply circuit and a power-supply line that is on the substrate, and wherein the electric power is supplied to the second terminal from the power-supply terminal via the second power-supply circuit and the power-supply line.

4. The power amplifier according to claim 3, wherein the chip device further comprises an output terminal, and wherein the output terminal is on a signal output line, the signal output line connecting the first transmission line to the output matching network.

5. The power amplifier according to claim 4, wherein the output terminal is on the same side of the hybrid coupler as the first terminal and the second terminal.

6. The power amplifier according to claim 2, wherein the chip device further comprises the first power-supply circuit and the second power-supply circuit, and an output terminal, wherein the electric power is supplied to the first terminal from the power-supply terminal via a power-supply line that is on the substrate, wherein the electric power is supplied to the second terminal from the power-supply terminal via the power-supply line, and wherein the output terminal is on a signal output line, the signal output line connecting the first transmission line to the output matching network.

7. The power amplifier according to claim 2, wherein the hybrid coupler comprises a dielectric layer interposed between the first transmission line and the second transmission line in a thickness direction.

8. The power amplifier according to claim 7, wherein, in the hybrid coupler, an area of a cross-section of the first transmission line in a plane perpendicular to a current-flow direction of the first transmission line is larger than an area of a cross-section of the second transmission line in a plane perpendicular to a current-flow direction of the second transmission line.

9. The power amplifier according to claim 2, wherein the first power-supply circuit comprises a choke inductor, and wherein the choke inductor is electrically connected in series between the second end of the first transmission line and the power-supply terminal.

10. The power amplifier according to claim 2, wherein the first power-supply circuit comprises an auto-transformer comprising a first winding and a second winding, wherein the first winding is electrically connected in series between the second end of the first transmission line and the output matching network, and wherein the second winding is electrically connected in series between the power-supply terminal and a node between a first end of the first winding and the second end of the first transmission line.

11. The power amplifier according to claim 2, wherein the first power-supply circuit comprises a transmission-line transformer comprising a first line and a second line, wherein the first line is electrically connected in series between the second end of the first transmission line and the output matching network, and wherein the second line is electrically connected in series between the power-supply terminal and a node between a first end of the first winding and the second end of the first transmission line.

12. The power amplifier according to claim 2, wherein the first power-supply circuit comprises a conventional transformer comprising a primary winding and a secondary winding, wherein the primary winding is electrically connected in series between the second end of the first transmission line and the power-supply terminal, and wherein the secondary winding is electrically connected in series between a reference potential and the output matching network.

\* \* \* \* \*